United States Patent
Muffler

(10) Patent No.: US 10,919,071 B2
(45) Date of Patent: Feb. 16, 2021

(54) ROTARY PLATE FOR HOLDING A SUBSTRATE FOR A COATING DEVICE

(71) Applicant: OBDUCAT AB, Lund (SE)

(72) Inventor: Pirmin Muffler, Orsingen-Nenzingen (DE)

(73) Assignee: Obducat AB, Lund (SE)

( * ) Notice: Subject to any disclaimer, the term of this patent is extended or adjusted under 35 U.S.C. 154(b) by 136 days.

(21) Appl. No.: 15/562,006

(22) PCT Filed: Mar. 23, 2016

(86) PCT No.: PCT/EP2016/056322
§ 371 (c)(1),
(2) Date: Sep. 27, 2017

(87) PCT Pub. No.: WO2016/156134
PCT Pub. Date: Oct. 6, 2016

(65) Prior Publication Data
US 2018/0036761 A1    Feb. 8, 2018

(30) Foreign Application Priority Data

Mar. 27, 2015  (DE) ........................ 10 2015 104 735

(51) Int. Cl.
| | |
|---|---|
| *B05D 3/12* | (2006.01) |
| *B05C 13/00* | (2006.01) |
| *H01L 21/683* | (2006.01) |
| *H01L 21/687* | (2006.01) |
| *B05C 11/08* | (2006.01) |
| *B05D 1/00* | (2006.01) |
| *H01L 21/67* | (2006.01) |

(52) U.S. Cl.
CPC .............. *B05C 13/00* (2013.01); *B05C 11/08* (2013.01); *B05D 1/005* (2013.01); *H01L 21/6838* (2013.01); *H01L 21/68742* (2013.01); *H01L 21/6715* (2013.01)

(58) Field of Classification Search
CPC ........ B05C 11/08; B05C 13/00; B05D 1/005; H01L 21/6838; H01L 21/6715; H01L 21/68742
USPC .............................................. 427/240; 118/52
See application file for complete search history.

(56) References Cited

U.S. PATENT DOCUMENTS

| | | | | |
|---|---|---|---|---|
| 6,132,113 A | * | 10/2000 | Yu ........................ | G03F 7/3021 396/611 |
| 2015/0037499 A1 | * | 2/2015 | Breingan ................ | B05C 13/00 427/240 |
| 2016/0375462 A1 | * | 12/2016 | Kaneko .................. | B05D 1/005 427/294 |

FOREIGN PATENT DOCUMENTS

| | | |
|---|---|---|
| DE | 102012100030 A1 | 7/2013 |
| JP | 63115214 U | 7/1988 |
| JP | 07302830 A | 11/1995 |

(Continued)

OTHER PUBLICATIONS

English translation of JP 2005-116842 A, pub. Apr. 28, 2005.*
International search report for patent application No. PCT/EP2016/056322 dated May 24, 2016.

*Primary Examiner* — Kirsten Jolley
(74) *Attorney, Agent, or Firm* — Bachman & LaPointe, PC

(57) ABSTRACT

A rotary plate for holding a substrate for a coating device, which rotary plate comprises a plurality of suction points, is intended to be characterized by an annular elevation, wherein a diameter of the annular elevation substantially corresponds to a diameter of the substrate.

10 Claims, 1 Drawing Sheet

(56) References Cited

FOREIGN PATENT DOCUMENTS

JP       09115808 A     5/1997
JP    2005116842 A     4/2005

* cited by examiner

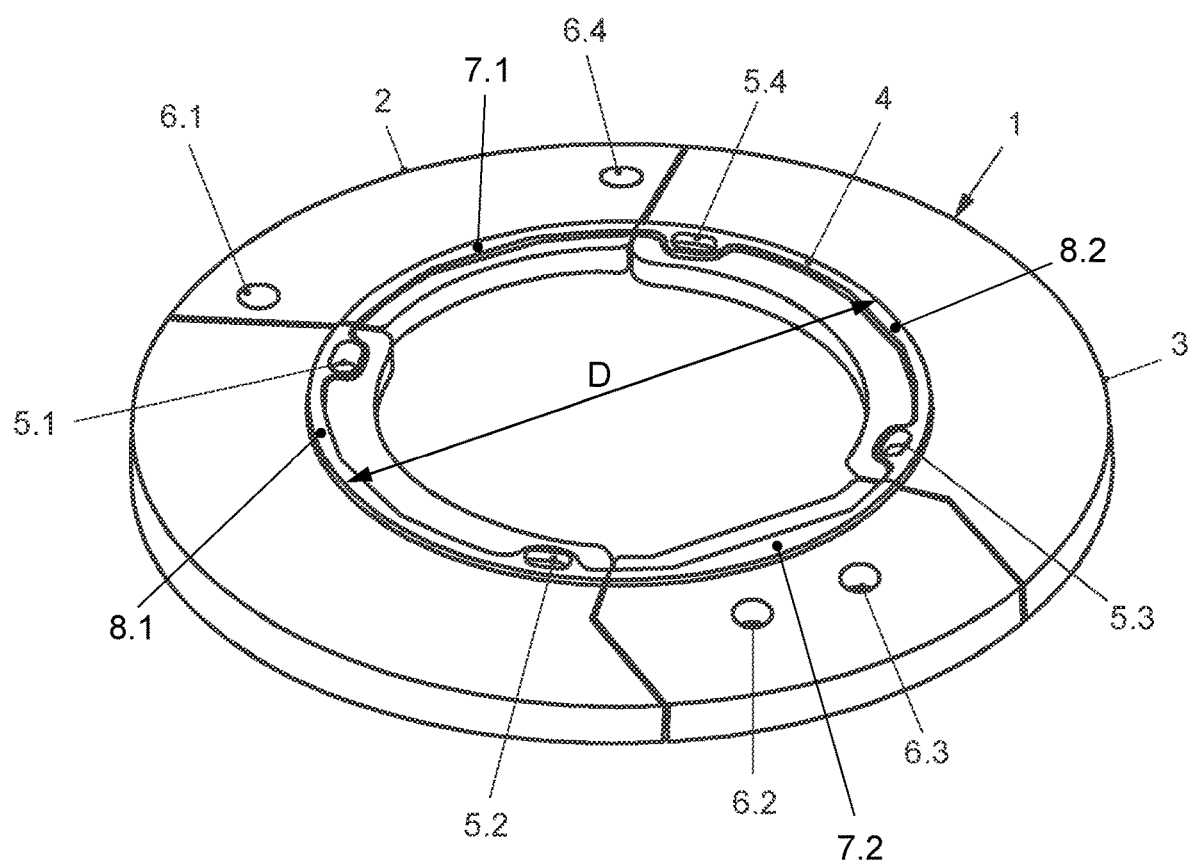

ROTARY PLATE FOR HOLDING A SUBSTRATE FOR A COATING DEVICE

TECHNICAL FIELD

The invention relates to a rotary plate for holding a substrate for a coating device and to a method for coating a substrate on a rotary plate.

PRIOR ART

Various rotary plates for coating substrates/wafers are known from the prior art. For example, DE 10 2012 100 030 A1 presents a rotary plate for holding a substrate, the suction points of which rotary plate are at a distance from the surface of the substrate plate.

A disadvantage of rotary plates from the prior art that the coating may possibly pass during the coating of the substrate/wafer onto undesirable surfaces, in particular the lower side, of the substrate/wafer. This takes place, for example, due to capillary forces which arise between the substrate/wafer and the rotary plate on which the substrate/wafer rests during the coating.

Problem of the Invention

It is the problem of the invention to provide a rotary plate which can achieve greater quality during the coating of wafers without, for example, the coating being able to pass here onto undesirable surfaces, in particular onto the lower side of the wafer.

Solution to the Problem

The features disclosed herein lead to the solution. Advantageous refinements are described herein and in the dependent claims.

A rotary plate according to the invention for holding a substrate/wafer for a coating device comprises, in a typical exemplary embodiment, a plurality of suction points on a side assigned to the substrate. This makes it possible for the substrate/wafer to be sucked via the suction points and to thereby be able to be held securely on the rotary plate and fixed for the coating. Furthermore, the substrate/wafer can thereby be prevented from falling from the rotary plate or changing its position during the rotation of the coating operation. The risk of damage which would arise through other holding elements, for example clamps, can also be prevented or at least minimized by fixing the substrate/wafer.

A rotary plate according to the invention furthermore comprises an annular elevation. The diameter, in particular the outside diameter, of the annular elevation substantially corresponds here to a diameter, in particular an outside diameter, of the substrate/wafer.

As a result, the coating can be prevented during the coating operation from being able to pass onto undesirable surfaces of the substrate/wafer, in particular onto a lower side of the substrate/wafer due to capillary forces arising between the rotary plate and the substrate/wafer. The lower side of the substrate/wafer generally corresponds to that side of the substrate/wafer which rests on the annular elevation of the rotary plate and therefore faces the rotary plate. Consequently, by means of the configuration according to the invention of the rotary plate, the quality of the coating of the substrate/wafer can be increased.

In a typical exemplary embodiment, the rotary plate furthermore comprises a mobile part and a fixed part. By means of the division of the rotary plate into the mobile part and the fixed part, simple placing/laying and/or taking off/removing the substrate/wafer onto the rotary plate and/or from the rotary plate can be made possible. In order to make possible the placing/laying and/or taking off/removing in a simple manner, in an exemplary embodiment the annular elevation comprises a mobile-part annular portion and a fixed-part annular portion. The mobile-part annular portion is assigned here to the mobile part of the rotary plate and the fixed-part annular portion is assigned to the fixed part of the rotary plate.

In a typical exemplary embodiment, the suction points for sucking the substrate/wafer are arranged within the annular elevation. The suction points are preferably arranged within the mobile-part annular portion.

In a typical exemplary embodiment, the suction points are designed as an oval opening in the longitudinal direction of the annular elevation since particularly good suction properties can thereby be achieved. The oval opening describes a cross section which preferably has two opposite circular or arc portions which, in turn, are connected to each other by two substantially parallel straight lines. In further exemplary embodiments, the opening of the suction points has an elliptical, circular or polygonal cross-sectional shaping.

In order to make lifting and/or lowering of the mobile part possible, the latter is preferably mounted movably in relation to/with respect to the fixed part. By means of the lowering or lifting of the mobile part, at least one partial region of an edge portion of the substrate/wafer is released to an extent such that the latter can be picked up by a transporting device, for example a robot arm. In an exemplary embodiment, the mobile part has for this purpose a lifting unit for lifting away/lifting and/or lowering the mobile part in relation to the fixed part.

In a typical exemplary embodiment, the mobile-part annular portion and the fixed-part annular portion of the annular elevation are manufactured from a material which, firstly, permits secure and reliable suction of the substrate/wafer without damaging the latter and, secondly, ensures sufficient sealing between the substrate/wafer and the rotary plate in order to prevent inadvertent coating of the lower side of the substrate/wafer, which lower side is in contact with the annular elevation.

The method for coating a substrate/wafer on a rotary plate in a coating device comprises, in an exemplary embodiment, the following steps:

lifting or lowering the mobile part of the rotary plate, laying a substrate/wafer onto the annular elevation of the rotary plate, wherein the outer edge of the substrate/wafer is substantially flush with an outer edge of the mobile-part annular portion if the mobile part of the rotary plate has been lifted, and is substantially flush with an outer edge of the fixed-part annular portion if the mobile part of the rotary plate has been lowered, lifting or lowering the mobile part of the rotary plate until the entire annular elevation is in contact with the substrate, wherein the outer edge of the substrate/wafer is substantially flush with the outer edge of the annular elevation, sucking the substrate/wafer onto the annular elevation of the rotary plate via the suction points, coating the substrate, in particular by rotational coating, releasing/ending the suction of the substrate/wafer on the annular elevation of the rotary plate, lifting or lowering the mobile part of the rotary plate, extracting/removing the coated substrate/wafer from the rotary plate.

The individual method steps can be varied and/or interchanged in sequence depending on the design of the rotary plate. Furthermore, modifications of the method steps that are obvious to a person skilled in the art and/or the omission of individual method steps in order to optimize the method are likewise intended to be included.

DESCRIPTION OF THE FIGURE

Further advantages, features and details of the invention emerge from the description below of the single FIGURE. The latter shows a perspective top view of a rotary plate according to the invention.

DETAILED DESCRIPTION

The FIGURE illustrates a rotary plate 1 according to the invention which is a holder for a substrate/wafer (not illustrated) in a coating device. The rotary plate 1 comprises a plurality of suction openings 5.1-5.4. Furthermore, the rotary plate 1 comprises an annular elevation 4 which has a diameter D. In the exemplary embodiment illustrated, the diameter D corresponds to an outside diameter of the annular elevation. Furthermore, in a typical exemplary embodiment, the diameter substantially corresponds to an outside diameter of the substrate/wafer.

In the exemplary embodiment illustrated, the annular elevation 4 is divided into two fixed-part annular portions 7.1 and 7.2 and into two mobile-part annular portions 8.1 and 8.2. The fixed-part annular portions 7.1 and 7.2 are assigned here to a fixed part 2 and the mobile-part annular portions 8.1 and 8.2 are assigned to a mobile part 3.

The suction points 5.1-5.4 are preferably arranged within the annular elevation 4. In particular, the suction points 5.1-5.4 are arranged within the mobile-part annular portions 8.1 and 8.2. In further exemplary embodiments (not illustrated), the suction points 5.1-5.4 are arranged within the fixed-part annular portions 7.1 and 7.2 or both within the fixed-part annular portions 7.1 and/or 7.2 and the mobile-part annular portions 8.1 and/or 8.2. Furthermore, the number of suction points is not fixed to the number of four suction points depicted in the exemplary embodiment, but rather can be selected and realized to be either lower or higher.

In a typical exemplary embodiment, the suction points 5.1-5.4, as illustrated in the exemplary embodiment, are designed as oval openings. The oval opening of the suction points 5.1-5.4 preferably has two opposite circular-arc-shaped or arcuate rounded portions which are connected to each other at the ends thereof by two substantially parallel straight lines. The oval openings of the suction points 5.1-5.4 are preferably arranged in a longitudinal direction of the annular elevation 4. That is to say, the straight lines of the oval openings are oriented substantially parallel to a tangential straight line which adjoins the outside diameter of the annular elevation 4 in the region of the respective suction point 5.1-5.4.

In a typical exemplary embodiment, the mobile part 3 of the rotary plate 1 is mounted movably with respect to the fixed part 2. The movable mounting of the mobile part 3 makes it possible for the substrate/wafer to be able to be deposited onto the rotary plate 1 and/or to be able to be lifted off/removed from the rotary plate 1 by a transporting means (not illustrated). The effect achieved here by lifting or lowering the mobile part 3 is that at least part of the outer edge of the substrate/wafer is no longer in contact with the annular elevation 4 and it is thereby made possible for the transporting means to deposit the substrate/wafer onto the rotary plate 1 or to grasp same again after the coating and supply same to a next processing position. The mobile part 3 preferably has a lifting unit which enables the lifting away and/or the lowering of the mobile part 3 with respect to the fixed part 2.

In order to connect the rotary plate 1 to the coating device, the rotary plate 1 has at least one screw opening 6.1-6.4 preferably in the region of the fixed part 2. In a typical exemplary embodiment, the screw openings 6.1-6.4 are suitable for receiving a fastening means, by means of which the rotary plate 1 can be connected to the coating device.

The function of the rotary plate 1 according to the invention is described with reference to a method for coating the substrate/wafer on the rotary plate 1 depicted in the exemplary embodiment.

In order to deposit an untreated substrate/an untreated wafer onto the rotary plate 1, the mobile part 3 of the rotary plate 1 is lifted or lowered. As soon as the mobile part 3 is lifted or lowered, a substrate/wafer can be laid onto the annular elevation 4 of the rotary plate 1 by a transporting means.

In a typical exemplary embodiment, the edge of the substrate/wafer is substantially flush here with the outer edge of the mobile-part annular portions 8.1 and 8.2 or of the fixed-part annular portions 7.1 and 7.2. Whether the outer edge of the substrate/wafer upon being deposited is flush with the outer edge of the mobile-part annular portions 8.1 and 8.2 or of the fixed-part annular portions 7.1 and 7.2 is dependent on whether the mobile part 3 is lifted or lowered.

As soon as the substrate/wafer has been deposited onto the mobile-part annular portions 8.1 and 8.2 or the fixed-part annular portions 7.1 and 7.2 of the annular elevation 4 of the rotary plate 1 by the transporting means, the mobile part 3 of the rotary plate 1 is lifted or lowered until the entire annular elevation 4 is in contact with the substrate/wafer. The outer edge of the substrate is substantially flush here with the outer edge of the annular elevation 4.

The substrate/wafer is subsequently sucked onto the rotary plate 1 via the suction points 5.1-5.4. If, in the exemplary embodiment illustrated, the mobile part 3 of the rotary plate 1 is lifted for the laying of the substrate/wafer, the substrate/wafer, directly after being laid on, can be sucked onto the mobile-part annular portions 8.1 and 8.2 via the suction points 5.1-5.4.

After the substrate/wafer has been sucked on the annular elevation 4 of the rotary plate 1 via the suction points 5.1-5.4, the rotary plate 1 can be set into rotation and the substrate/wafer can be coated.

After the coating has taken place and the rotation of the rotary plate 1 has ended, the suction via the suction points 5.1-5.4 can be released and the mobile part 3 of the rotary plate 1 can be lifted or lowered.

The substrate/wafer can subsequently be extracted or removed from the rotary plate 1 by a transporting means and supplied to the next processing step.

LIST OF REFERENCE SIGNS

1. Rotary plate
2. Fixed part
3. Mobile part
4. Annular elevation
5. Suction point
6. Screw opening 7. Fixed-part annular portion
8. Mobile-part annular portion
D. Diameter

The invention claimed is:

1. Method for engaging a substrate to a rotary plate (1) in a coating device, wherein said rotary plate comprises a plurality of suction points (5.1-5.4), an annular elevation (4), wherein a diameter (D) of the annular elevation (4) corresponds to a diameter of the substrate, wherein the annular elevation (4) comprises a mobile-part annular portion (8.1, 8.2) and a fixed-part annular portion (7.1, 7.2), wherein the mobile-part annular portion is moveable relative to the fixed-part annular portion between a coating position wherein the mobile-part annular portion and the fixed-part annular portion are aligned and together support the substrate to be coated, and a loading position wherein one portion of the mobile-part annular portion and the fixed-part annular portion is elevated relative to the other portion of the mobile-part annular portion and the fixed-part annular portion such that a substrate to be loaded or unloaded is supported only by the one portion, the method comprising the following steps:
   positioning the mobile part annular portion and the fixed part annular portion in the loading position,
   laying the substrate onto the annular elevation (4) of the one portion, such that an edge of the substrate is flush with an outer edge of the annular portion (8.1, 8.2, 7.1, 7.2) of the one portion,
   positioning the mobile part annular portion and the fixed part annular portion in the coating position such that the entire annular elevation (4) is in contact with the substrate, and such that the outer edge of the substrate is flush with the outer edge of the annular elevation,
   adhering the substrate onto the rotary plate (1) via the suction points (5.1-5.4), and
   coating the substrate, whereby coating material can be prevented from being able to pass onto undesirable surfaces of the substrate during coating.

2. The method according to claim 1, characterized in that the annular elevation (4) comprises the suction points (5.1-5.4).

3. The method according to claim 1, characterized in that the mobile-part annular portion (8.1, 8.2) comprises the suction points (5.1-5.4).

4. The method according to claim 1, characterized in that the suction points (5.1-5.4) are oval openings in the longitudinal direction of the annular elevation (4).

5. The method according to claim 1, characterized in that the mobile part annular portion has a lifting unit for lifting away and/or lowering the mobile part annular portion from the fixed part annular portion.

6. The method according to claim 1, characterized in that the mobile part annular portion and the fixed part annular portion comprise complementary sector portions of the rotary plate.

7. The method according to claim 6, characterized in that the mobile part annular portion comprises two diametrically opposing sector portions.

8. The method of claim 1, further comprising the following steps:
   sucking the substrate onto the rotary plate (1) via the suction points (5.1-5.4),
   coating the substrate,
   releasing suction of the substrate positioning the mobile part annular portion and the fixed part annular portion in the loading position, and
   extracting/removing the substrate from the rotary plate (1).

9. The method according to claim 1, wherein the annular portion is defined at an outside diameter by a vertical wall, and wherein the vertical wall aligns substantially with an outside diameter of the substrate, whereby risk of capillary forces pulling coating material onto a bottom surface of the substrate is minimized.

10. The method according to claim 1, wherein the rotary plate defines a flat plane, and wherein the annular elevation is elevated above the flat plane, whereby the substrate is supported above the flat plane in both the coating position and the loading position.

* * * * *